United States Patent [19]
Koizumi et al.

[11] Patent Number: 5,194,236
[45] Date of Patent: Mar. 16, 1993

[54] PROCESS FOR PREPARING NbN SUPERCONDUCTING MATERIAL

[75] Inventors: Mitsue Koizumi, 6-22, Tamaicho 3-chome, Toyonaka-shi, Osaka; Yoshinari Miyamoto, 8-37, Midoridai 1-chome, Kawanishi-shi, Hyogo; Manshi Ooyanagi, Ootsu; Kimiaki Tanihata, Hyogo; Osamu Yamada, Takatsuki; Ichiro Matsubara, Ikeda; Hiroshi Yamashita, Kawanishi, all of Japan

[73] Assignees: Mitsue Koizumi, Toyanaka; Yoshinari Miyamoto, Kawanishi; Sumitomo Electric Industries, Ltd., Osaka, all of Japan

[21] Appl. No.: 730,410

[22] Filed: Jul. 16, 1991

[30] Foreign Application Priority Data

Jul. 16, 1990 [JP] Japan .................................. 2-187727

[51] Int. Cl.$^5$ .............................................. C01B 21/06
[52] U.S. Cl. ........................................ 423/409; 505/1; 505/810; 505/815
[58] Field of Search .................... 423/409; 505/1, 810, 505/815

[56] References Cited

U.S. PATENT DOCUMENTS 3,726,643 4/1973 Merzhanou et al. ................. 423/409

OTHER PUBLICATIONS

I. P. Borovinskaya et al., "Self-Propagating High-Temperature Synthesis of Titanium Nitrides under High Nitrogen Pressure", *Sov. Powder, Metall. & Met. Ceram. (USA), vol. 17, No. 11 (Apr. 1979), pp. 851-853.*
William M. Albrecht et al., "Reaction of Nitrogen with Niobium," Report No. BMI-1360, UC-25 Metallurgy and Ceramics (TID-4500, 14th Ed. (published Jul. 6, 1959).
N. Pessall et al., "A Study of Superconductivity in Interstitial Compounds", *J. Phys. Chem. Solids*, vol. 29, pp. 19-38 (1968).

*Primary Examiner*—Wayne Langel
*Attorney, Agent, or Firm*—Pennie & Edmonds

[57] ABSTRACT

Process for preparing NbN superconducting material, characterized in that a bulk Nb is placed in powder including at least one metal which can be nitriding-burned, and then the powder is heated to be nitriding-burned in pressurized $N_2$ atmosphere so that the bulk Nb is nitrided by the nitriding-burning of the powder.

8 Claims, 2 Drawing Sheets

PROCESS FOR PREPARING NBN SUPERCONDUCTING MATERIAL

BACKGROUND OF THE INVENTION

1. Field of the Invention

The present invention relates to a process for preparing Nb superconducting material, and more specifically to a process for preparing bulk NbN superconducting material directly.

2. Description of Related Art

The critical current density $J_c$ of alloy superconductors such NbTi and of A15 type composite superconductors such as Nb$_3$Sn and V$_3$Ga is only about $10^5$ A/cm$^2$ (at 8 T, 4.2 K). On the contrary, Nb which is a kind of B1 type composite superconductors has such relative high critical temperature $T_c$ as 17 K among known superconductors except high-$T_c$ oxide superconductors and has the highest critical current density $J_c$ of $1 \times 10^7$ A/cm$^2$ (0 T) and $2 \times 10^6$ A/cm$^2$ (20 T) of all known superconductors. Furthermore, NbN has a good resistance to radiation or neutron flux, which has hundredfold improvement as compared to A15 type superconductors. NbN has also such high superconducting magnet properties that the upper critical magnetic field $H_c 2$ measured with a anisotropic thin film of NbN is 43 T. On the other hand, NbN has not only excellent superconducting properties but also shows high heat resistance, hardness and mechanical strength.

Because NbN is so hard that it is hardly processable, NbN superconductor has been used in a form of thin films prepared by sputtering or other methods. However, there is such tendency that the critical current density $J_c$ decrease with increase of film thickness.

NbN superconductor is expected to be used in wires of solenoid of a nuclear fusion reactor owing to its good superconducting properties and high mechanical strength.

However, it was impossible to produce a bulk NbN superconductor. Here to fore, a NbN superconductor wire was produced by depositing a thin film of NbN on a core metal.

SUMMARY OF THE INVENTION

Accordingly, it is an object of the present invention to solve the problem and to provide a process for preparing NbN superconductor material.

The above object of the present invention is achieved in accordance with the present invention by a process for preparing NbN superconducting material, characterized in that a bulk Nb is placed in powder including at least one metal which can be nitriding-burned, and then the powder is nitriding-burned in pressurized N$_2$ atmosphere so that the bulk Nb is nitrided by the heat supply of nitriding-burning of the powder.

The process in accordance with present invention utilize a second nitriding-burning heat of Nb powder to cause rapid nitriding reaction of a bulk Nb so that the bulk Nb is nitrided directly to be a bulk NbN. In the nitriding-burning reaction, the metal powder is nitriding-burned.

The metal powder is a nitriding-burning material. According to the present invention, the metal is selected from Nb, Ti and other metals which can nitriding-burn at high temperature enough to cause nitriding reaction of Nb.

Preferably, a reaction controlling component powder is added to the metal powder to control the temperature of the nitriding-burning. In case of using Nb as the metal, NbN is used as the reaction controlling component and in case of Ti, TiN or Al$_2$O$_3$ is used as the reaction controlling component. The amount of the reaction controlling component powder is preferably 5 to 40 mol % of the total amount of the compound powder which consists of the metal powder and the reaction controlling component powder.

Preferably, the weight of the compound powder is 1 to 50 fold to that of the bulk Nb. If the weight of the compound powder is less than the range, the reaction will not proceed sufficiently. It is no use to use the compound powder exceeding the range.

According to the present invention, the process is carried out in an atmosphere under a pressure of 1 to 150 atm, preferably 5 to 100 atm. The process carried out under the pressure less than 1 atm will proceed slowly or will not proceed sufficiently. It will give no advantage and is not economical to carry out the process under the pressure exceeding 150 atm.

Under the described conditions, the compound powder is heated and initiates nitriding-burning. In fact, the bulk Nb is heated very rapidly to temperature of 2400° to 2500° C. within 1 to 2 seconds. The nitriding reaction finishes within 2 to 3 seconds and a bulk NbN superconductor which can not be prepared in the prior art is obtained. Therefore, the process in accordance with the present invention is very efficient.

The above object, features and advantages of the present invention will be apparent from the following description of preferred embodiments of the invention with reference to the accompanying drawings.

DESCRIPTION OF THE PREFERRED EMBODIMENTS

Figure 1:
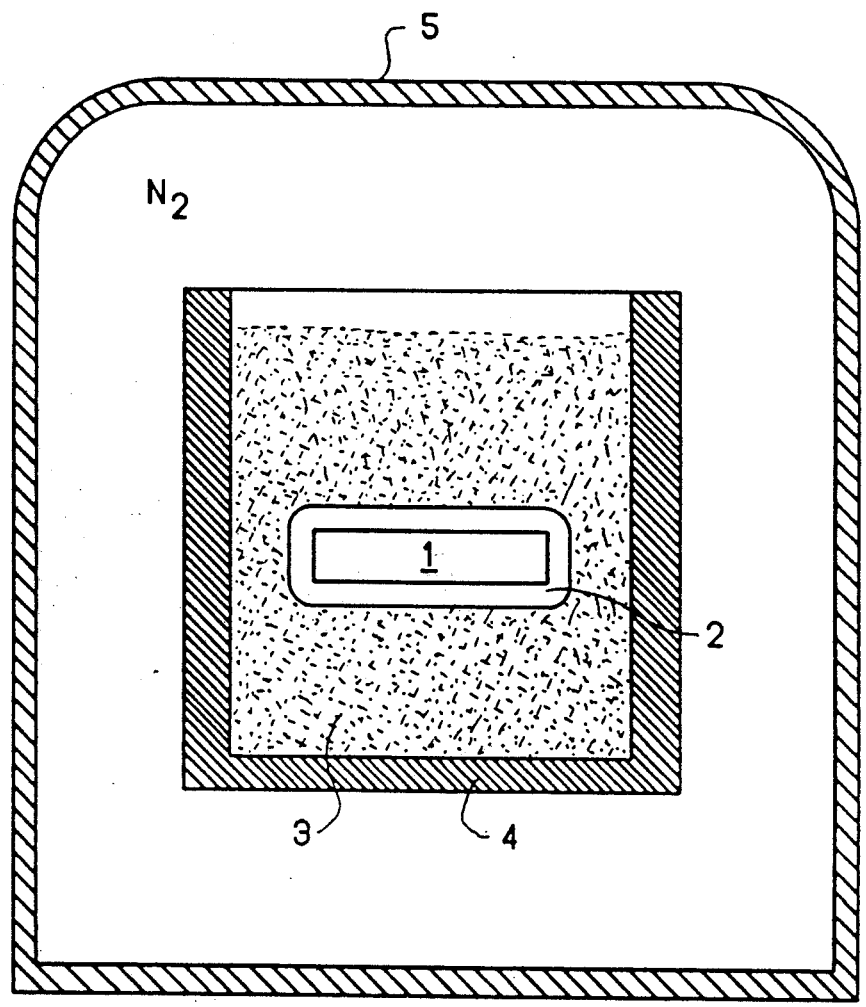
FIG. 1 is a schematic view of a bulk Nb which is treated by a nitriding process in accordance with the present invention.

Referring to FIG. 1, there is shown a schematic view of a bulk Nb which is treated by a process in accordance with the present invention. In FIG. 1, a bulk Nb 1 is wrapped by a Nb foil 2 and placed in a carbon vessel 4 in a high pressure chamber 5. Compound powder 3 which consists of 85 parts of Nb and 15 parts of NbN powder, which is the reaction controlling component, is charged in the vessel 4 in such a manner that the wrapped Nb plate 1 is surrounded with the component powder 3. The Nb powder and the NbN powder are commercially available and have a particle size of 44 μm.

The Nb foil 2 prevents the bulk Nb 1 from being welded to the compound powder 3 during the reaction but is not always necessary. In this embodiment, two Nb wires (50 μmφ × 20 mm and 127 μmφ × 20 mm) and two Nb plates (127 μm × 2 mm × 20 mm and 1000 μm × 2 mm × 20 mm) were treated and only the Nb wires were wrapped by Nb foil.

After the chamber 5 is pressurized with N$_2$ of 100 atm, the vessel 4 was heated by a high frequency coil (not shown) so that the compound powder 3 is nitriding-burned. The reaction finished in few seconds. The operation was repeated 4 times to obtain two NbN wires and two NbN plates.

The superconducting properties of the NbN wires and NbN plates were measured and the micro structures of the NbN wires and NbN plates were examined under a transmission electron microscope. The result revealed that the NbN wires consisted of NbN phase alone.

Figure 2:
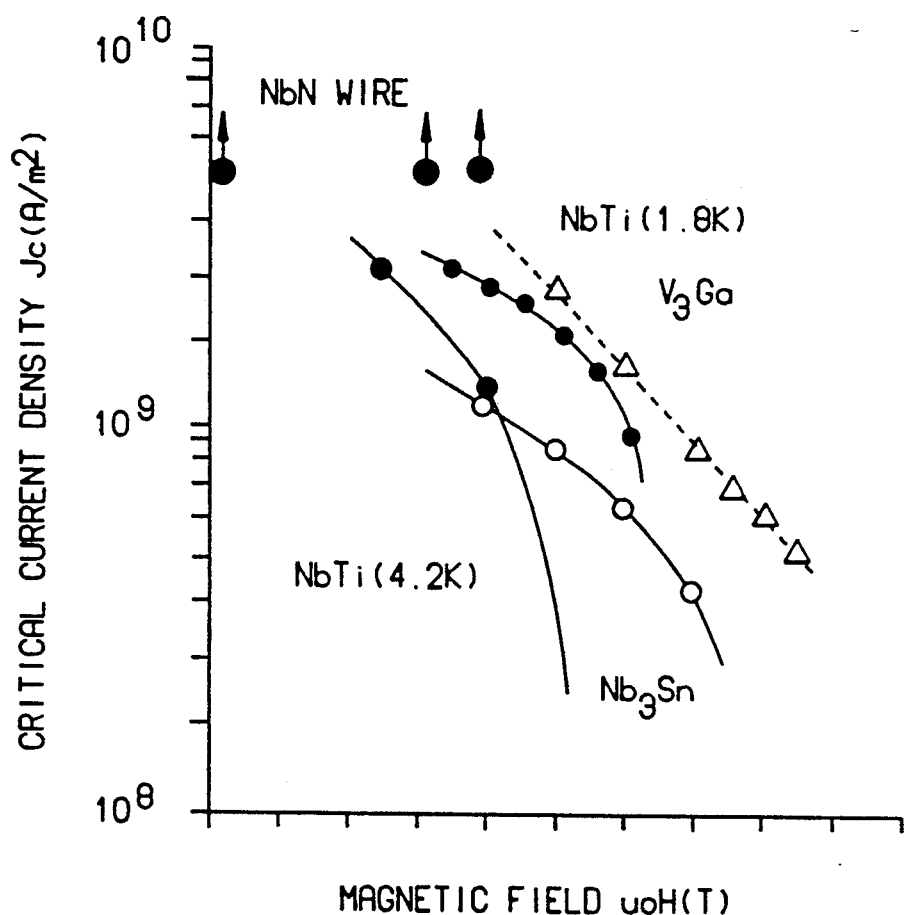
FIG. 2 is a graphical representation which shows the change of the critical current density of NbN wires which were prepared by the process in accordance with the present invention and other superconductors in the magnetic field.

The superconducting properties of the NbN wires and NbN plates are shown in Table 1 and the change of critical current density of NbN wires which were prepared by the process in accordance with the present invention and other superconductors in magnetic field are shown in FIG. 2.

TABLE 1

| NbN material | Jc (A/cm2) | magnetic field (T) |
|---|---|---|
| wire (50 μmϕ) | $5.09 \times 10^5$ | 7.5 |
| wire (127 μmϕ) | $7.89 \times 10^4$ | 7.5 |
| plate (127 μm thick) | $3.94 \times 10^2$ | 7.5 |
| plate (1000 μm thick) | 12 | 1.0 |

The invention has thus been shown and described with reference to the specific embodiments. However, it should be noted that the present invention is in no way limited to the details of the illustrated structures but changes and modifications may be made within the scope of the appended claims.

We claim:

1. Process for preparing NbN superconducting material, characterized in that a bulk Nb is placed in powder including at least one metal which can be nitride-burned, and then said powder is nitride-burned in pressurized $N_2$ atmosphere so that said bulk Nb is nitrided rapidly by heat supply of said nitriding-burning of said powder.

2. A process claimed in claim 1 wherein said powder is nitride-burned in $N_2$ atmosphere under a pressure range from 1 to 150 atm.

3. A process claimed in claim 2 wherein said powder is nitride-burned in $N_2$ atmosphere under a pressure range from 5 to 100 atm.

4. A process claimed in claim 1 wherein the amount of said metal which is included said powder is 1–50 times by weight of said bulk Nb.

5. A process claimed in claim 1 wherein said powder includes said metal and at least one component which controls the temperature of the nitride-burning.

6. A process claimed in claim 5 wherein said powder includes 5–40 mol % of said component which controls the temperature of the nitride-burning.

7. A process claimed in claim 6 wherein said metal is Ti and said component which controls the temperature of the nitride-burning is TiN.

8. A process claimed in claim 6 wherein said metal is Ti and said component which controls the temperature of the nitride-burning is $Al_2O_3$.

* * * * *